United States Patent [19]

Stahl

[11] 4,144,118

[45] Mar. 13, 1979

[54] METHOD OF PROVIDING PRINTED CIRCUITS

[75] Inventor: Fritz Stahl, Am Kehn, Fed. Rep. of Germany

[73] Assignee: Kollmorgen Technologies Corporation, Dallas, Tex.

[21] Appl. No.: 885,648

[22] Filed: Mar. 13, 1978

[30] Foreign Application Priority Data

Mar. 23, 1977 [DE] Fed. Rep. of Germany ....... 2713393

[51] Int. Cl.$^2$ .............................................. C23F 1/02
[52] U.S. Cl. .................................... 156/659; 156/667; 156/901; 156/904; 204/15; 427/98; 428/901
[58] Field of Search ............... 204/15, 23, 32 R, 38 R; 427/96–99; 428/901; 29/625–627; 174/68.5; 156/150, 659, 656, 666, 667, 904, 901, 902; 252/79.2

[56] References Cited

U.S. PATENT DOCUMENTS

| | | | |
|---|---|---|---|
| 3,296,099 | 1/1967 | Dinella | 204/15 |
| 3,745,094 | 7/1973 | Greene | 204/15 |
| 3,764,399 | 10/1973 | Caule | 428/901 X |
| 4,075,757 | 2/1978 | Malm et al. | 156/902 X |

*Primary Examiner*—William A. Powell
*Attorney, Agent, or Firm*—Morgan, Finnegan, Pine, Foley & Lee

[57] ABSTRACT

There is provided an improvement in the method of preparing printed circuit boards by chemically catalyzing the surface of an insulating material, electrolessly depositing a layer of copper thereon, masking selected areas of the copper layer not correspnding to the desired pattern of conductor lines, electrolytically depositing additional copper on the unmasked areas, removing the masking material and etching away the copper from the previously masked areas. The improvement comprises the steps of forming an etch-resistant protective layer of oxide on the surface of the electrolytically deposited copper layer before removing the masking material, then removing the masking material and etching away the electrolessly deposited copper from the previously masked areas.

12 Claims, No Drawings

METHOD OF PROVIDING PRINTED CIRCUITS

This invention relates to an improvement in the production of printed circuits in accordance with the so-called "build-up" method. The improvement protects the layer of copper deposited on areas corresponding to the desired circuit pattern from the corrosive effects of etchants, and permits the use of longer etching times to more completely remove copper from those areas not corresponding to the desired circuit pattern.

BACKGROUND OF THE INVENTION

The production of printed circuit boards by the so-called "build-up" method is known in the art. In this method, an insulating carrier or base material, e.g., a molded laminate, is provided with a relatively thin layer of copper on its surface. The surface of the copper layer is then printed with a layer of masking material, which covers all of the areas not corresponding to the desired pattern of conductor lines. The desired pattern of conductor lines is then built up, preferably by means of the galvanic or electrolytic deposition of copper, and if desired, additional metals such as tin/lead alloys, nickel, gold, and the like. Thereafter, the layer of masking material is removed and the thin layer of previously masked copper, which is now exposed, is decomposed by an etching treatment.

Printed circuit boards manufactured by the procedure just described, the conductor lines of which consist exclusively of copper, have penetrated numerous fields of application, for reasons of economy in manufacture and because of their excellent solderability. The introduction of the so-called "build-up" method has also made practical the use of printed circuits with metallized through-hole walls in the field of electronics. Before then, the inherently high costs of production precluded their use, despite acknowledged advantages in assembly of apparatus and in the improved reliability of soldered connections.

Such prior art methods are subject to a number of disadvantages, however. In general, in these methods the surface of the carrier material, which preferably is provided with an adhesion-promoting layer, the latter being made microporous using known techniques, is catalyzed for the electroless deposition of metal using a sensitizing solution containing palladium, and preferably a solution of a Pd (II)/Sn (II) chloride complex. Then, using known procedures, a thin layer of copper having a thickness, for example, of from 1 to 3 microns, is built up by means of electroless deposition.

Preferably, for the production of printed circuits having metallized through-hole walls, perforations are made in the carrier material before the application of the metal layer by electroless deposition. After electroless deposition, a masking material is applied in the known manner, e.g., by means of screen printing or photographing printing, and the unmasked, i.e., exposed, areas of the electrolessly deposited copper layer are then built up to the thickness desired for the conductor lines by means of electrolytic deposition, the copper layer acting as the current supply.

After the layer of masking material is removed, this portion of the electrolessly deposited layer of copper, now exposed, must be removed by etching. In order to ensure adequately high surface resistance values between adjacent conductor lines, it is necessary not only to completely remove the electrolessly deposited copper, but also any residues from the catalyzing step. On the other hand, especially in the case of conductor lines built up with copper only, care must be taken to prevent too great an amount of the conductor line copper from being carried away in the etching treatment. Such excess losses of copper, especially in the case of metallized through-hole walls, result in the formation of defects in the layer of deposited copper, unless the etching treatment is very carefully controlled.

It is known that longer etching times are made possible by electrolytically depositing a layer of copper of greater than normal thickness. However, this leads to increases in the cost of production, which is especially undesirable in the manufacture of circuit boards having conductor lines consisting only of copper.

The aforementioned disadvantages of the prior art are avoided by the method of this invention in an economical and reliable manner. This invention also permits the use of an etching treatment which need not be as carefully controlled in comparison with prior art methods.

DESCRIPTION OF THE INVENTION

In its broadest aspects, this invention provides an improvement in the method of preparing a printed circuit board comprising the steps of chemically catalyzing the surface of an insulating material for the electroless deposition of metal, electrolessly depositing a layer of copper on said catalyzed surface, providing a layer of masking material on selected areas of the electrolessly deposited copper layer to leave an area of exposed copper in a desired pattern of conductor lines, building up an additional layer of copper on said exposed areas by electrolytic deposition, removing the layer of masking material and etching away the layer of electrolessly deposited copper from the previously masked areas. The improvement comprises:

(a) before removing said masking material, forming an etch-resistant protective layer of oxide on the surface of the exposed layer of electrolytically deposited copper;

(b) removing said masking material from the layer of electrolessly deposited copper; and (c) etching away the electrolessly deposited copper from the previously masked areas, to provide a printed circuit board having the desired surface pattern of conductor lines with an etch-resistant protective oxide layer thereon.

In practice, after the electrolytical deposition of copper, the unmasked layer of electrolytically deposited copper is subjected to an oxidizing treatment. Then, the layer of masking material is removed so that the now exposed non-oxidized layer of electrolessly deposited copper can be removed, such as by the use of known alkaline etching agents.

This invention permits the use of prolonged etching times. For example, etching times can be doubled in comparison with what is permissible with prior art methods, without any damage to the copper conductor lines now protected by the etch-resistant oxide layer. The process of this invention thus enables the removal of substantially all of the electrolessly deposited copper from the previously masked areas, as well as any chemical residues left over on the carrier surface from the catalyzing treatment.

Following the etching treatment, the etch-resistant protective oxide layer may be removed, preferably by immersing the work piece in a bath of dilute sulfuric acid.

The oxide removal step can also serve to clean the surface of the article prior to the application of a protective layer for preserving solderability.

A preferred composition for forming the etch-resistant protective oxide layer comprises an aqueous solution of sodium chlorite, sodium phosphate and caustic soda, e.g., sodium hydroxide.

DESCRIPTION OF THE PREFERRED EMBODIMENT

An especially preferred formulation for forming the etch-resistant protective oxide layer is as follows:

| Ingredients | Amount (grams per liter) |
|---|---|
| Sodium chlorite | 162 |
| Trisodium phosphate | 10 |
| Sodium hydroxide | 10 |
| Water | (to make 1 liter) |

Other modifications and variations are possible in the light of the above disclosure. It is to be understood, therefore, that changes may be made in the particular embodiments described herein which are within the full intended scope of the invention as defined in the appended claims.

I claim:

1. In a method of preparing a printed circuit board comprising the steps of chemically catalyzing the surface of an insulating material for the electroless deposition of metal, electrolessly deposited a layer of copper on said catalyzed surface, providing a layer of masking material on selected areas of the electrolessly deposited copper layer to leave an area of exposed copper in a desired pattern of conductor lines, building up an additional layer of copper on said exposed areas by electrolytic deposition, removing the layer of masking material and etching away the layer of electrolessly deposited copper from the previously masked areas, the improvement which comprises:

(a) before removing said masking material, forming an etch-resistant protective layer of oxide on the surface of the exposed layer of electrolytically deposited copper;

(b) removing said masking material from the layer of electrolessly deposited copper; and (c) etching away the electrolessly deposited copper from the previously masked areas, to provide a printed circuit board having the desired surface pattern of conductor lines with an etch-resistant protective oxide layer thereon.

2. A process as defined in claim 1 wherein said etching treatment is prolonged to remove, in addition to the electrolessly deposited copper, any chemical residues from the catalyzing step from said previously masked areas.

3. A process as defined in claim 1 in which the insulating material includes one or more through-holes.

4. A process as defined in claim 1 wherein the layer of electrolessly deposited copper has a thickness of from 1 to 3 microns.

5. A process as defined in claim 1 which comprises the further step of applying a layer of an adhesion-promoting material to the surface of said insulating material before the catalyzing step.

6. A process as defined in claim 5 wherein the insulating material includes through-holes.

7. A process as defined in claim 6 wherein said through-holes are formed before the application of said adhesion-promoting layer.

8. A process as defined in claim 6 wherein said through-holes are formed after the application of said adhesion-promoting layer.

9. A process as defined in claim 1 which comprises the additional step of removing said protective oxide layer from the surface of said electrolytically deposited copper.

10. A process as defined in claim 9 wherein said removal is accomplished by contacting said oxide layer with dilute sulfuric acid.

11. A method as defined in claim 1 wherein said protective oxide layer is formed by contacting said exposed layer of electrolytically deposited copper with an aqueous solution comprising sodium chlorite, trisodium phosphate and sodium hydroxide.

12. A method as defined in claim 11 wherein said solution comprising, per liter, 160 grams of sodium chlorite, 10 grams of trisodium phosphate and 10 grams of sodium hydroxide, the balance comprising water.

* * * * *